United States Patent [19]

Susak et al.

[11] Patent Number: 4,990,863
[45] Date of Patent: Feb. 5, 1991

[54] AMPLIFIER OUTPUT STAGE

[75] Inventors: David M. Susak, Chandler; Byron G. Bynum, Gilbert, both of Ariz.

[73] Assignee: Motorola, Inc., Schaumburg, Ill.

[21] Appl. No.: 481,268

[22] Filed: Feb. 20, 1990

[51] Int. Cl.[5] .............................................. H03F 3/30
[52] U.S. Cl. .................................... 330/265; 330/267
[58] Field of Search ............... 330/262, 263, 265, 266, 330/267, 268

[56] References Cited

FOREIGN PATENT DOCUMENTS 126812  5/1989  Japan ................................... 330/267

Primary Examiner—James B. Mullins
Attorney, Agent, or Firm—Michael D. Bingham

[57] ABSTRACT

An amplifier output stage with minimum circuitry and optimum performance for providing a SAT-to-SAT output voltage signal at an output terminal. The amplifier output stage includes a first transistor having a collector coupled to the output terminal for sourcing current thereto, a base coupled to a first supply voltage terminal, and an emitter coupled to the first supply voltage terminal. A second transistor having a collector coupled to the output terminal for sinking current thereat, a base, and an emitter coupled to a second supply voltage terminal. A third transistor having a collector, a base coupled to the base of the second transistor, and an emitter coupled to the second supply voltage terminal by a first resistor. A fourth transistor having a collector coupled to the first supply voltage terminal, a base coupled to an input terminal, and an emitter coupled to the base of the third transistor. A fifth transistor having a collector coupled to the base of the first transistor, a base coupled to the collector of the third transistor, and an emitter coupled to the second supply voltage terminal and a sixth transistor having a collector coupled to the first supply voltage terminal, a base coupled to the first supply voltage terminal and to the second supply voltage terminal, and an emitter coupled to the base of the fifth transistor.

10 Claims, 1 Drawing Sheet

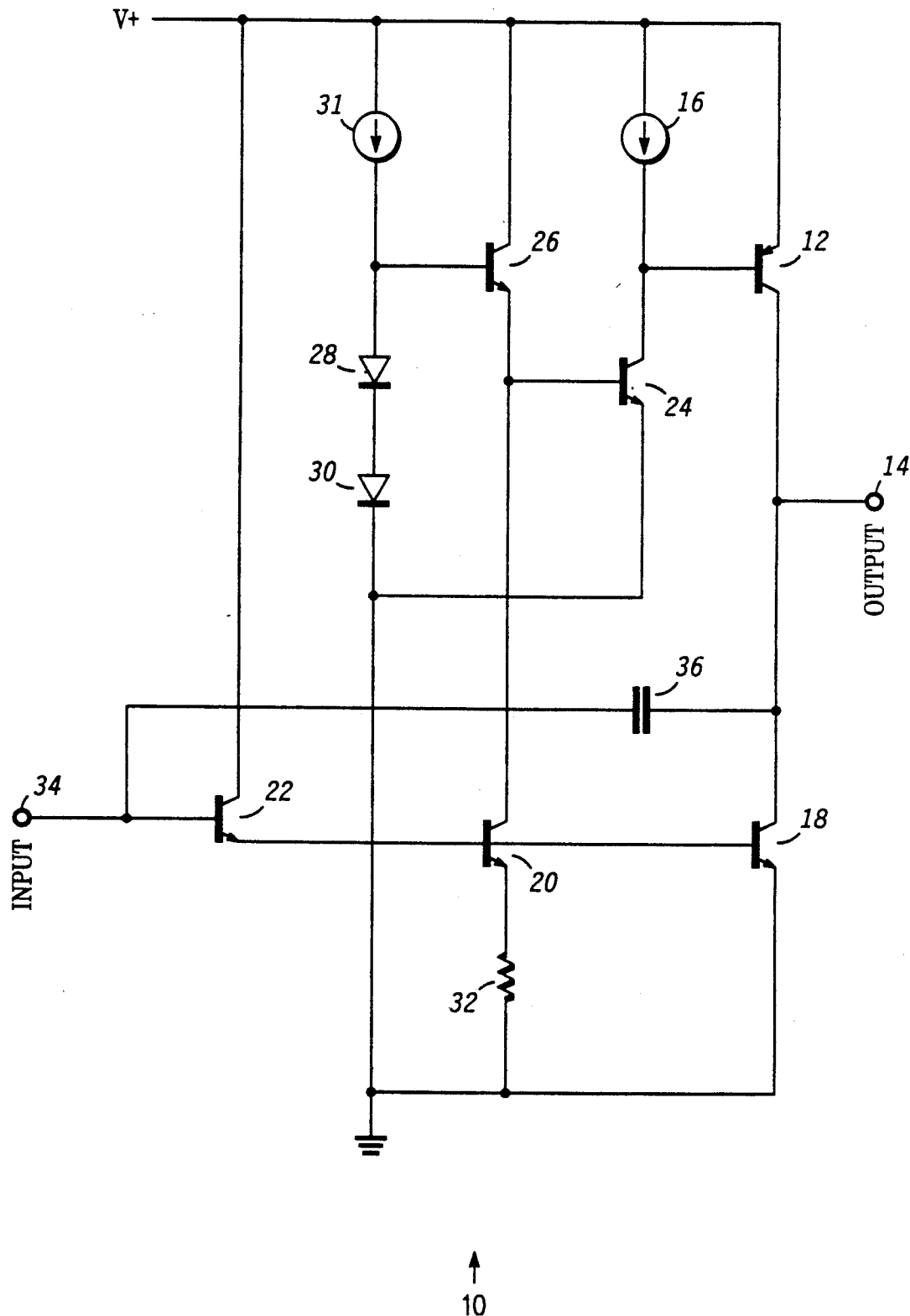

AMPLIFIER OUTPUT STAGE

CROSS REFERENCE TO A RELATED APPLICATION

The subject matter of the present invention is related to the subject matter of a patent application filed on Nov. 27, 1989, entitled "Amplifier Output Stage", Ser. No. 442,261 which is assigned to the Assignee of record for the present invention.

BACKGROUND OF THE INVENTION

The present invention relates to operational amplifiers and, more particularly, to integrated circuit amplifiers having output stages for providing increased output voltage swings.

Typical amplifier output stages utilize a pull up and a pull down transistor which are cascaded between positive and negative voltage supply rails for providing an output that is taken at the interconnection of the two transistors as is understood. Generally an emitter follower configured transistor is coupled between the bases of the pull up and pull down transistors which receives an input signal supplied from the input or middle stage. A quiescent bias current is supplied directly to the base of the pull up transistor and through the emitter of the aforementioned emitter follower transistor to the base of the pull down transistor. Due to this conventional configuration, a problem occurs in the prior art since the output stage voltage swing is thereby limited within a range of two base-emitter voltages (2 $V_{BE}$) plus two collector-emitter saturation voltages $V_{CE(SAT)}$ of the two supply rail voltages. Since a typical $V_{CE(SAT)}$ value is 0.3 volts and a typical $V_{BE}$ value is 0.7 volts, the output voltage swing may be reduced by two volts from the algebraic difference of the two supply rail voltages. Thus, for a voltage supply rail difference range of two volts, the output voltage may swing 100 millivolts or less which is too small for most applications. However, if the two base-emitter voltages could be obviated, the output voltage swing could be increased by as much as 1.4 volts thereby achieving an output swing practical for even low supply voltages.

Prior art has made at least one attempt at providing an amplifier output stage having larger output voltage swings and is fully described in pending U.S. application Ser. No. 442,261 filed on Nov. 27, 1989 entitled "AMPLIFIER OUTPUT STAGE", the teaching of which is incorporated herein by reference made thereto. However, the above noted prior art requires the use of a low impedance voltage supply to obtain the increased output voltage swing. Furthermore, generating a low impedance voltage source can be difficult especially at high frequencies.

Hence, a need exists for an amplifier output stage circuit for providing increased output voltage swings with minimum components and optimum performance.

SUMMARY OF THE INVENTION

Accordingly, it is an object of the present invention to provide an improved amplifier output stage.

Another object of the present invention is to provide an improved amplifier output stage having increased output voltage swings with minimum circuitry.

Still another object of the present invention is to provide an improved amplifier output stage having increased output voltage swings with low supply voltages.

In carrying out the above and other objects of the present invention, there is provided an amplifier output stage for accepting an input signal at an input terminal and providing current at an output terminal comprising a first transistor having a collector coupled to the output terminal for sourcing current thereto, and a base and an emitter coupled to a first supply voltage terminal; a second transistor having a collector coupled to the output terminal for sinking current thereat, a base, and an emitter coupled to a second supply voltage terminal; a third transistor having a collector, a base coupled to the base of the second transistor, and an emitter coupled to the second supply voltage terminal by a first resistor; a fourth transistor having a collector coupled to the first supply voltage terminal, a base coupled to the input terminal, and an emitter coupled to the base of the third transistor; a fifth transistor having a collector coupled to the base of the first transistor, a base coupled to the collector of the third transistor, and an emitter coupled to the second supply voltage terminal; and a sixth transistor having a collector coupled to the first supply voltage terminal, a base coupled to the first supply voltage terminal and to the second supply voltage terminal, and an emitter coupled to the base of the fifth transistor.

The above and other objects, features and advantages of the present invention will be better understood from the following detailed description taken in conjunction with the accompanying drawings.

BRIEF DESCRIPTION OF THE DRAWINGS

The sole FIGURE is a detailed schematic diagram illustrating the preferred embodiment of the present invention.

DETAILED DESCRIPTION OF THE PREFERRED EMBODIMENT

Referring to the sole FIGURE, a detailed schematic diagram of amplifier output stage 10 of the present invention is shown comprising transistor 12 having a collector coupled to output terminal 14, a base coupled to a first supply voltage terminal, at which the operating potential V+ is applied, via independent current source 16, and an emitter coupled to operating potential V+. Transistor 18 has a collector coupled to output terminal 14, a base coupled to the base and emitter of transistors 20 and 22, respectively, and an emitter returned to ground reference. Transistor 24 has a collector coupled to the base of transistor 12, a base coupled to the collector of transistor 20 and to an emitter of transistor 26, and an emitter returned to ground reference. Transistor 26 has a collector coupled to operating potential V+ and a base coupled to ground reference by the series combination of diodes 28 and 30 and to operating potential V+ by independent current source 31. It is known that diodes 28 and 30 can be formed by transistors having their respective bases and collectors shorted together as is understood. Furthermore, it is also known that independent current sources 16 and 31 can be comprised of any means to generate a reference current. Furthermore, the emitter of transistor 20 is coupled to ground reference by resistor 32 and the collector of transistor 22 is coupled to operating potential V+. Finally, the base of transistor 22 is coupled to input terminal 34 and to output terminal 14 by capacitor 36.

In operation, a decrease in voltage input supplied at input terminal 34 causes a decrease in voltage at the base of transistors 22, 20 and 18 thereby decreasing the collector current of transistors 20 and 18. Since the current through diodes 28 and 30 is substantially constant due to the biasing of independent current source 31, the voltage across diodes 28 and 30 is also substantially constant. Therefore, a decrease in collector current of transistor 20 results in a decrease of the base emitter voltage of transistor 26 and an increase in the base emitter voltage of transistor 24 which increases the current through transistor 24. This increased current through transistor 24 must be drawn from the base of transistor 12 which effectively increases the collector current of transistor 12 which is sourced to output terminal 14 the latter of which is typically coupled to an external load. Therefore, a decrease in voltage at input terminal 34 results in an increase of current sourced to output terminal 14.

On the other hand, an increase in voltage at input terminal 34 causes an increase in voltage at the base of transistors 22, 20 and 18 thereby increasing the current through transistors 20 and 18. Furthermore, this increased current through transistor 18 is supplied by sinking current from output terminal 14. Also, for the same reasons as stated above, an increase in current through transistor 20 will cause an increase in the base emitter voltage of transistor 26 and decrease in the base emitter voltage of transistor 24 which decreases the current through transistor 24. This decreased current through transistor 24 results in a decrease in base current through transistor 12 which effectively decreases the collector current of transistor 12. Therefore, an increase in voltage at input terminal 34 results in an increase of sinking current from output terminal 14.

Furthermore, since output terminal 14 is coupled directly to operating potential V+ through transistor 12 and directly to ground reference through transistor 18, the output voltage is allowed to swing to within the saturation voltages of transistors 12 and 18 of the supply voltage rails, V+ and ground, as expressed in Eqn. 1.

$$0V(GRD) + V_{CE(SAT-TRAN\ 18)} < \text{output swing} < V+ - V_{CE(SAT-TRAN\ 12)}. \quad (1)$$

Furthermore, this increased output voltage swing will now allow the amplifier output stage to be useful even at small rail to rail voltages, that is a small V+. Also, capacitor 36 provides negative feedback from output terminal 14 to input terminal 34. This negative feedback maintains a low output impedance at output terminal 14 over the useful frequency range and can be utilized to set a dominant pole for stabilizing the frequency response of the overall amplifier.

It is worth noting that if transistor 12 enters saturation, its base current will increase rapidly. This increased base current will flow through transistor 24 which could result in a large current spike in the power supplies. However, a resistor can be coupled between the emitter of transistor 24 and ground reference to limit any high current peaks.

By now it should be appreciated that there has been provided a novel amplifier output stage with minimum components for providing greater output voltage swings.

What is claimed is:

1. An amplifier output stage for providing load current at an output thereof responsive to an input signal supplied at an input thereof comprising:

a first transistor having a collector coupled to the output for sourcing current thereto, a base coupled to a first supply voltage terminal, and an emitter coupled to said first supply voltage terminal;

a second transistor having a collector coupled to the output for sinking current therefrom, a base, and an emitter coupled to a second supply voltage terminal;

a third transistor having a collector, a base coupled to said base of said second transistor, and an emitter coupled to said second supply voltage terminal;

a fourth transistor having a collector coupled to said first supply voltage terminal, a base coupled to the input, and an emitter coupled to said base of said third transistor;

a fifth transistor having a collector coupled to said base of said first transistor, a base coupled to said collector of said third transistor, and an emitter coupled to said second supply voltage terminal; and a sixth transistor having a collector coupled to said first supply voltage terminal, a base coupled to said first supply voltage terminal and to said second supply voltage terminal, and an emitter coupled to said base of said fifth transistor.

2. The amplifier output stage according to claim 1 further comprising:

first independent current source means coupled to said first supply voltage terminal and said base of said first transistor for supplying a first current; and second independent current source means coupled between said first supply voltage terminal and said base of said sixth transistor for supplying a second current.

3. The amplifier output stage according to claim 2 further comprising:

first and second diode means coupled between said base of said sixth transistor and said second supply voltage terminal for providing a predetermined voltage.

4. The amplifier output stage according to claim 3 including a capacitor coupled between the output and the input of the amplifier output stage.

5. The amplifier output stage according to claim 1 further comprising:

a first resistor coupled between said emitter of said third transistor and said second supply voltage terminal.

6. An improved amplifier output stage for providing load current at an output thereof responsive to an input signal supplied at an input thereof comprising:

a first transistor having a collector coupled to the output for sourcing current thereto, a base coupled to a first supply voltage terminal, and an emitter coupled to said first supply voltage terminal;

a second transistor having a collector coupled to the output for sinking current therefrom, a base, and an emitter coupled to a second supply voltage terminal;

a third transistor having a collector, a base coupled to said base of said second transistor, and an emitter coupled to said second supply voltage terminal; and a fourth transistor having a collector coupled to said first supply voltage terminal, a base coupled to the input, and an emitter coupled to said base of said third transistor; wherein the improvement comprises:

a fifth transistor having a collector coupled to said base of said first transistor, a base coupled to said collector of said third transistor, and an emitter coupled to said second supply voltage terminal; and a sixth transistor having a collector coupled to said first supply voltage terminal, a base coupled to said first supply voltage terminal and to said second supply voltage terminal, and an emitter coupled to said base of said fifth transistor.

7. The amplifier output stage according to claim 6 further comprising:

first independent current source means coupled to said first supply voltage terminal and said base of said first transistor for supplying a first current; and second independent current source means coupled between said first supply voltage terminal and said base of said sixth transistor for supplying a second current.

8. The amplifier output stage according to claim 7 further comprising:

first and second diode means coupled between said base of said sixth transistor and said second supply voltage terminal for providing a predetermined voltage.

9. The amplifier output stage according to claim 8 including a capacitor coupled between the output and the input of the amplifier output stage.

10. The amplifier output stage according to claim 6 further comprising:

a first resistor coupled between said emitter of said third transistor and said second supply voltage terminal.

* * * * *